United States Patent
Greiner et al.

(10) Patent No.: US 9,026,968 B2
(45) Date of Patent: May 5, 2015

(54) VERIFICATION ASSISTANCE FOR DIGITAL CIRCUIT DESIGNS

(71) Applicant: International Business Machines Corporation, Armonk, NY (US)

(72) Inventors: Carsten Greiner, Holzgerlingen (DE); Gerrit Koch, Ammerbuch (DE); Juergen Ruf, Tuebingen (DE); Ken Werner, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/192,070

(22) Filed: Feb. 27, 2014

(65) Prior Publication Data

US 2014/0310668 A1    Oct. 16, 2014

(30) Foreign Application Priority Data

Apr. 10, 2013    (GB) .................................. 1306497.7

(51) Int. Cl.
*G06F 17/50* (2006.01)
*G06F 9/455* (2006.01)

(52) U.S. Cl.
CPC .................................. *G06F 17/5068* (2013.01)

(58) Field of Classification Search
CPC ............ G06F 17/5036; G06F 17/5045; G06F 17/5009; G06F 17/50; G06F 17/504; G06F 2217/04
USPC .................................. 716/104, 106, 111, 139
See application file for complete search history.

(56) References Cited

U.S. PATENT DOCUMENTS

| | | | |
|---|---|---|---|
| 6,618,839 B1 | 9/2003 | Beardslee et al. | |
| 6,885,983 B1 | 4/2005 | Ho et al. | |
| 7,367,001 B2 | 4/2008 | Baumgartner et al. | |
| 7,784,006 B1 | 8/2010 | Duthou et al. | |
| 8,121,825 B2 | 2/2012 | Jain et al. | |
| 2005/0010880 A1* | 1/2005 | Schubert et al. ................. | 716/4 |
| 2009/0248390 A1 | 10/2009 | Durand et al. | |
| 2009/0307638 A1 | 12/2009 | McConaghy | |
| 2010/0185992 A1* | 7/2010 | Auerbach et al. ................. | 716/5 |
| 2011/0246831 A1 | 10/2011 | Das et al. | |
| 2012/0179447 A1 | 7/2012 | Lin et al. | |

FOREIGN PATENT DOCUMENTS

WO        0165422 A2    9/2001

OTHER PUBLICATIONS

Mentor Graphics Corporation, Questa® Codelink Turbo (Questa Codelink Turbo Datasheet—Europractice), Source: Mentor Graphics, p. 1, Copyright 2011. Download date: Feb. 26, 2014 http://www.europractice.stfc.ac.uk/vendors/mg_codelink-cve-ds.pdf.

* cited by examiner

*Primary Examiner* — Brian Ngo
(74) *Attorney, Agent, or Firm* — Russell Ng PLLC; Matthew Baca (57) ABSTRACT

To assist verification of a digital circuit design, a data processing system presents, within a graphical user interface of a display device, a presentation including a plurality of verification notifications arising from verification of a digital circuit design. The data processing system detects one or more user operations by which a user interacts with the plurality of verification notifications utilizing one or more user input devices and stores, in a memory, user operation information regarding the one or more user operations detected by the data processing system. The data processing system determines, based on said user operation information, a recommended subsequent user operation and presents, within the graphical user interface, an indication of the recommended subsequent user operation.

18 Claims, 6 Drawing Sheets

VERIFICATION ASSISTANCE FOR DIGITAL CIRCUIT DESIGNS

BACKGROUND OF THE INVENTION

The present invention relates to verification assistance for digital circuit designs.

In the development of digital circuits, the largest fraction of design time is usually spent on detecting design flaws. For the analysis of the functional behavior of the design of digital circuits, circuit designers review verification data. In this context, verification data are data used for verification and, in particular, the verification of digital circuits. The verification data can include messages or entries in a database, which can be presented as a list and displayed on a monitor. The verification data typically include trace data generated by trace programs and/or debug data generated by debug programs. Trace programs log signal values or events of interest in digital circuit designs and/or derive further information from signal values or events of interest during the simulation of the digital circuits. Thus, trace data usually refer to simulation data obtained by the simulation of a digital circuit. Debug programs compare simulation data obtained by the simulation of a digital circuit to reference data. Thus, debug data usually refer to the comparison of simulation data and reference data. In U.S. Pat. No. 8,121,825, US 2012/0179447, US 2009/0248390, US 2011/024831, U.S. Pat. No. 6,618,839, U.S. Pat. No. 6,885,983, U.S. Pat. No. 7,367,001 various trace and debug programs are disclosed.

The amount of verification data for a digital circuit design can be very large. Usually only a small fraction of the verification data is useful for the identification of design flaws. In practice, a large proportion of the time spent in verification of a digital circuit design is spent on finding the useful verification data. The useful verification data can often be identified by the content and the interlinkage to other verification data. According to the preamble of its claim 1, U.S. Pat. No. 7,200,588 discloses a verification assistance method for the design of digital circuits that enables the selection of verification data to be displayed on a monitor for review by circuit designers, thereby alleviating the handling of a huge amount of verification data. However, this verification assistance method does not support the circuit designers in selecting useful verification data to be displayed for review so that it is likely that the circuit designers actually select useless verification data to be displayed. Therefore, the verification assistance method may not considerably reduce the time and effort spent on spotting design flaws.

BRIEF SUMMARY

According to a first aspect of the present invention, a verification assistance method for reviewing verification data, in particular verification data for a digital circuit design, comprises the following steps: storing user operation information; and recommending a user operation based on said user operation information. Although being highly suitable for the verification of a digital circuit design, the present invention is not limited to this application. Preferably, user operation information encompasses any details of one or several user operations in one or several previous user operation sequences. Preferably, a user operation is a considered operation (an operation taken into account) of a user while executing the verification assistance method. Preferably the considered user operations include the input of data in the text fields, the selection of components of the graphical user interface, and the pressing of buttons of the graphical user interface, the mouse, the keyboard, and/or vocal commands. Preferably, only certain user operations are generally considered, wherein these user operations may include one or several of the operations mentioned above, and wherein the consideration may also depend on details of the operation. For example, an operation resulting only in the shift of a window of the graphical user interface may not be considered as a user operation in the context with the present invention, whereas an operation resulting in the choice of the data to be displayed like a filter action may be considered as a user operation in context with the present invention. A previous sequence of user operations is any sequence of user operations prior to the sequence of user operations for which the operation is recommended. Preferably, recommending includes offering the user the selection of a user operation by displaying a respective action button on the graphical user interface. As the method recommends user operations on the basis of information of user operations already performed, the circuit designer is supported in finding verification data explaining design flaws. Thus, the time and effort required for the verification and, thus, for the design and development of digital circuits are reduced. The invention can take the form of an entirely hardware embodiment, a software embodiment or an embodiment containing both hardware and software elements. Preferably, the invention is implemented in software, which includes but is not limited to firmware, resident software, microcode, etc.

In a preferred embodiment, the user operation information comprises a sequence position of a user operation in a previous sequence of user operations. The sequence position defines the position of the user operation in the previous sequence of user operations. The sequence position might be defined relative to the directly preceding user operation of the previous sequence of user operations. An entry of a directly preceding user operation might contain a reference to the user operation (and further user operations). The sequence might comprise a first user operation performed by the user or may start later than the first user operation.

In a further development of the preferred embodiment, the recommended user operation has the sequence position of the user operation in the previous sequence of user operations (i.e., if the recommended user operation was actually performed, it would have the sequence position of the user operation in the previous sequence of user operations). Preferably, the user operation information comprises information about the operations preceding the user operation in the previous sequence of user operations. The sequence of user operations including the recommended user operation may comprise a first user operation belonging to the user operations of which details are typically stored or may start later.

In yet another preferred embodiment, the recommended user operation is identical to a user operation in a previous sequence of user operations. In this context, identical user operations correspond to the same action command which can be executed independently of the context of the present operation (interlinkage of the present operation to further details of the simulation and/or circuit design), e.g., the circuit design which is simulated, the input vectors applied, and/or previous user operations. Such commands usually include no reference to the context of the present operation. Preferably, the verification assistance method checks whether an identical operation can be executed (results in a modification of the displayed verification data) in the present context and recommends only identical operations which can be executed.

In yet another preferred embodiment, the recommended user operation is analogous to a user operation in a previous sequence of user operations. In this context, analogous user operations correspond to action commands which are executed dependently of the context of the present operation, e.g., the circuit design which is simulated, the input vectors applied, and/or previous user operations. Such commands usually comprise at least one reference to the context of the present operation (interlinkage of the present operation to further details of the simulation and/or circuit design). Analogous operations are adaptable to their context and thereby enable the recommendation of useful operations dependent on their context. Preferably, the verification assistance method checks whether an analogous operation can be executed (results in a modification of the displayed verification data) in the present context and recommends only analogous operations which can be executed.

In a further development of the last preferred embodiment, the user operation information of the user operation in the previous sequence of user operations comprises reference information. The reference information specifies to which details in context of the user operation the user operation refers, e.g., the circuit design which is simulated, the input vectors applied, and/or previous user operations. Preferably, the reference information comprises an identifier. Preferably, the technique of verification assistance is adapted to recognize each respective detail in the verification data by means of an identifier. Preferably, the technique of verification assistance can recognize the possibility to execute an analogous operation by the presence of an identifier in the verification data.

In yet another preferred embodiment, the recommending step is based only on useful user operation information. Thus, useful operations can be defined as operations which are taken into account in the recommending step. Useful user operation information is information about one or several useful user operations. Operations can be defined as useful and/or useless operations. The definitions useful and/or useless operations can be stored as one or several user operation definition file(s). The user might also select whether an operation is useful or not (e.g., by pressing a button). Preferably, only details of useful user operations of an operation sequence remain stored after the end of the operation sequence, wherein details of all user operations of the sequence of user operations might be stored directly after the performance of each operation. These details might be deleted later when the user performs a specific operation indicating that the sequence of user operations is useless. Alternatively, the details for all operations of the sequence might be stored when the user performs an operation indicating that the sequence of user operations is useful. Preferably, the usefulness of recommended operations might be rated. For this purpose an operation count, which is incremented each time the respective operation in an operation sequence proves to be useful, could be used. The recommended operations could be ordered dependent of the operation count. Alternatively, only operations having the highest operation count could be recommended. As the technique for user verification assistance stores more and more useful user operation over time, the technique of user verification assistance is self-learning and the quality and variety of the recommended user operations can continuously augment.

In yet another preferred embodiment, the user operation information comprises details about several user operations. Preferably the previous user operations form one or several previous sequences of user operations. Preferably, the details about each user operation can comprise a sequence position and/or reference information. Preferably, the recommended user operation has the same sequence position as an identical or analogous user operation in the previous sequence of user operations. Preferably, each of the user operations performed before the recommending step is analogous or identical to a user operation having the same sequence position in the previous sequence of user operations.

In a further development of the last preferred embodiment, a further user operation is recommended based on the user operation information. Preferably, the further recommended user operation has the same sequence position as an identical or analogous user operation in the previous sequence of user operations. Preferably, each of the user operations performed preceding before the further recommending step is analogous or identical to a user operation having the same sequence position in the previous sequence of user operations.

In general, a verification assistance method can comprise any possible combination of features of the preferred embodiments and further developments.

According to a second aspect of the present invention, a verification assistance program for execution in a data processing system comprising program code portions for performing a verification assistance method for reviewing verification data, in particular for a digital circuit design, comprises the following steps: storing user operation information; and recommending a user operation based on the user operation information. The verification assistance program can be accessible from a computer-usable or computer-readable medium providing program code for use by or in connection with a computer or any instruction execution system. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). A data processing system suitable for storing and/or executing program code usually includes at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. In general, the verification assistance program can comprise any possible combination of features enabling the execution of the preferred embodiments and further developments of the verification assistance method mentioned above. In addition the verification assistance program can be integrated in a group of programs and formed as a module interacting with the other programs (modules).

According to a third aspect of the present invention, a computer program product stored on a computer usable medium, comprises computer readable program means to perform a verification assistance method, in particular for the design of digital circuits, with the following steps: storing user operation information; and recommending a user operation based on said user operation information. For the purposes of this description, a computer-usable or computer readable medium can be any apparatus that can contain, store, communicate, propagate or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and blue ray disk. Any combination of one or more computer readable medium(s) may be utilized. Program code embodied on a computer readable medium may be transmitted using any appropriate medium, including but not limited to wireless, wireline, optical fiber cable, RF, etc., or any suitable combination of the foregoing. In general, the computer program product can comprise any possible combination of features enabling the execution of the preferred embodiments and further developments of the verification assistance method mentioned above.

According to a fourth aspect of the present invention, a verification assistance system for reviewing verification data, in particular for a digital circuit design, comprises a storage means adapted to store user operation information and a recommendation means adapted to recommend a user operation based on the user operation information. The verification assistance system can be formed as a data processing system, wherein network adapters may also be coupled to the system to enable the data processing system to become coupled to other data processing systems or remote printers or storage devices through intervening private or public networks. Modems, cable modems and Ethernet cards are just a few of the currently available types of network adapters. Input/output or I/O devices (including but not limited to keyboards, displays, pointing devices, etc.) can be coupled to the system either directly or through intervening I/O controllers.

In a preferred embodiment, the recommendation means are adapted to recommend a user operation which is identical to a user operation of a previous sequence of user operations.

In yet another preferred embodiment, the recommendation means are adapted to recommend a user operation which is analogous to a user operation of a previous sequence of user operations.

In yet another preferred embodiment, the user operation information comprises details about several user operations.

In yet another preferred embodiment, the recommendation means is adapted to recommend a further user operation based on said user operation information.

In general, the verification assistance system can comprise any possible combination of features enabling the execution of the preferred embodiments and further developments of the verification assistance method mentioned above.

BRIEF DESCRIPTION OF THE SEVERAL VIEWS OF THE DRAWINGS

A detailed description of the invention is given in the following drawings in which.

DETAILED DESCRIPTION

Figure 1:
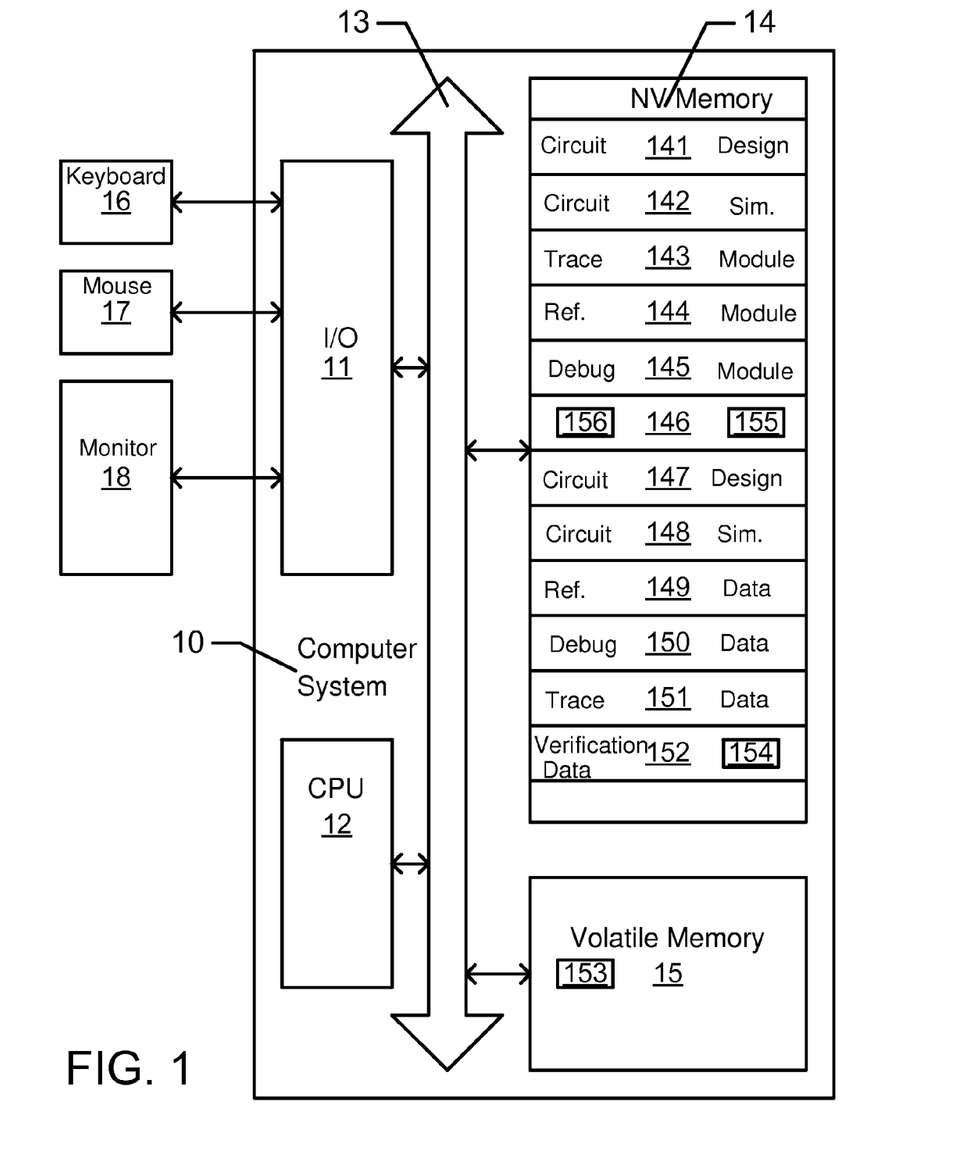
FIG. 1 shows the architecture of a computer system.

FIG. 1 shows the architecture of a computer system 10. The computer system 10 comprises an input/output device 11, a CPU 12, a bus 13, a non-volatile memory 14, and a volatile memory 15. The input/output device 11 is connected to a keyboard 16, a mouse 17, and a monitor 18. The input/output device 11, the CPU 12, the volatile memory 14, and the non-volatile memory 15 are directly connected to the bus 13 and can send and/or receive data to and from other components of the computer via the bus 13. In the non-volatile memory 14, system software (not shown), middleware (not shown), application software 141, 142, 143, 144, 145, 146, and application data 147, 148, 149, 150, 151 are stored. The volatile memory 15 is used for the execution of the system software, middleware, and application software. The basic computer architecture, the functioning and interaction of the computer components (input/output device 11, CPU 12, bus 13, non-volatile memory 14, and volatile memory 15), the system software, and middleware are known from the prior art and are therefore not described in detail.

The application software comprises a circuit design module 141, a circuit simulation module 142, a trace module 143, a reference module 144, a debug module 145, and a verification assistance module 146. The circuit design module 141, the circuit simulation module 142, the trace module 143, the reference module 144, the debug module 145, and the verification assistance module 146 may have to be compiled or may already have been compiled in order to generate a respective executable program. The application data comprise circuit design data 147, circuit simulation data 148, reference data 149, debug data 150, trace data 151, and verification data 152, wherein circuit design data 147 are data generated by the circuit design module 141, circuit simulation data 148 are data generated by the circuit simulation module 142, reference data 149 are data generated by the reference module 144, debug data 150 are data generated by the debug module 145, trace data 151 are data generated by the trace module 143, and verification data 152 are data generated by the verification assistance module 146.

The circuit design module 141 enables the description of a digital circuit (e.g., a processor) using a hardware description language (HDL), preferably a register transfer level (RTL) description language (HDL, e.g., VERILOG or VHDL). The design of the digital circuit is composed of at least one entity. The entity can be hierarchically ordered. An entity of a higher hierarchy can comprise several entities of a lower entity. Each entity is defined by an entity name, entity ports, and a function performed by the entity and typically comprises a number of interconnections connecting the entity ports to ports outside the entity. The ports are either input ports, output ports or bidirectional ports. The ports outside the entity can be input, output or bidirectional ports of further entities or the overall digital circuit. The design of the digital circuit is stored as one or several circuit design data file(s) 147.

The circuit simulation module 142 enables the simulation of the electronic behavior of the digital circuit stored as the circuit design data file(s), the display of the circuit design data on the monitor 18, the generation of a sequence of input vectors (each input vector is a complete set of input signals of the simulated digital circuit at a given time), the application of the input vectors to the input ports and/or bidirectional ports of the digital circuit, and the generation of circuit simulation data 148 as a function of time. The circuit simulation module 142 stores the circuit simulation data typically including the input vectors, the output vectors (each output vector is a complete set of output signals of the simulated digital circuit at a given time), and (details of) further signal values and events of interest to the simulated digital circuit as a function of time in one or several simulation data file(s) 148. For example, signal values of interest can be the output or input values of an entity. For example, events of interest can be the complete receipt or forwarding of a data packet by an entity.

The trace module 143 logs the states (e.g., the digital value of output or input signals) of the digital circuit or further events of interest during the simulation of the digital circuit. The trace module 143 can comprise code which is inserted in the circuit design data file(s) 147 and results in the output of trace messages which are stored in one or several trace data file(s) 151 during the execution of the code during the simulation of the digital circuit. Alternatively, the trace module 143 may be formed as a separate high-level language (e.g., C or C++) module which can extract signal values or further events of interest during the simulation, generate trace messages, and store them as one or several trace data file(s) 151. Typically, each trace message comprises a time stamp, local information, and a comment including an optional identifier. The trace message can also contain information derived from extracted signal values or events of interest. For example an error message is created if a function of sub-function of an entity or code of the design data file is not exercised during the simulation.

The reference module 144 is a module written in a high-level language like C or C++ or a hardware description language (HDL) like VHDL or VERILOG and enables the generation of expected output signals and/or further signals or events of interest using the input vectors generated by and received from the circuit design module. The reference module 144 stores the expected output signals and (details of) further signal values or events of interest as a function of time in one or several reference data file(s) 149.

The debug module 145 enables the comparison of simulation data to the reference data using the input vectors, the output vectors, (details of) further signal values and events of interest produced by and received from the circuit simulation module 142 and the output vectors, (details of) further signal values and events of interest produced by and received from the reference design simulation module 144. In this comparison, the signal values generated by the circuit simulation module 142 are compared to the corresponding signal values generated by the reference module 144 at a given time and debug messages are created on the basis of this comparison. Typically, each debug message comprises a time stamp, local information, and a comment including an optional identifier. For example, a specific debug message (error message) is generated if there is a discrepancy between the values generated by the circuit simulation module 142 and the respective values generated by the reference design simulation module 144. The debug module 145 stores the debug messages in one or several debug data file(s) 150.

The circuit design module 141, the circuit simulation module 142, the trace module 143, the reference design simulation module 144, the debug module 145 or at least similar modules are known from the state of the art. As far as the modules 141, 142, 143, 144, and 145 differ from known modules, a person skilled in the art could realize such modules from the description of the tasks enabled by the modules.

The verification assistance module 146 enables the analysis of verification messages including the trace messages and the debug messages and comprises a graphical user interface generation subprogram, a user operation handling subprogram, and a user operation processing subprogram. The graphical interface generation module generates the components of the graphical user interface displayed on the monitor based on one or several graphical user interface layout definition file(s) 156 which form(s) part of the verification assistance module 146. The components of the graphical user interface include text fields, check boxes, and instruction components like buttons enabling the entry of instructions. The user operation handling subprogram handles the user operations including the input of data in the text fields, the selection of components of the graphical user interface, and the pressing of buttons of the graphical user interface, the mouse, and the keyboard. The user operation handling subprogram sends instructions to the user operation processing subprogram based on the user operations. The user operation processing subprogram performs one or several operations based on the instructions received from the user operation handling subprogram. A typical operation is the modification or addition of one or several temporary graphical user interface layout definition file(s) 153 defining the layout of the graphical user interface. This modification or addition results in a modification of the graphical user interface to be displayed on the monitor. Apart from the modification or addition of the one or several graphical user interface layout definition file(s) 153, the user operation processing subprogram checks whether a user operation is useful or not and modifies or adds one or several user operation information data file(s) 154 included in the verification data 152 for storing user operation information. The user operation information data file(s) 154 are taken into account when the one or several temporary graphical user interface layout definition file(s) (recommendation window layout definition files) 153 defining the layout of one or several recommendation windows are generated. In these recommendation windows, the user can easily choose one or several recommended operations by pressing a dedicated button.

Graphical user interface generation subprograms, user operation handling subprograms, and user operation processing subprograms are known from the state of the art. As far as a person skilled in the art could implement such subprograms from the above description of the tasks performed by the subprograms, no further description is given hereinafter.

Figure 2A:
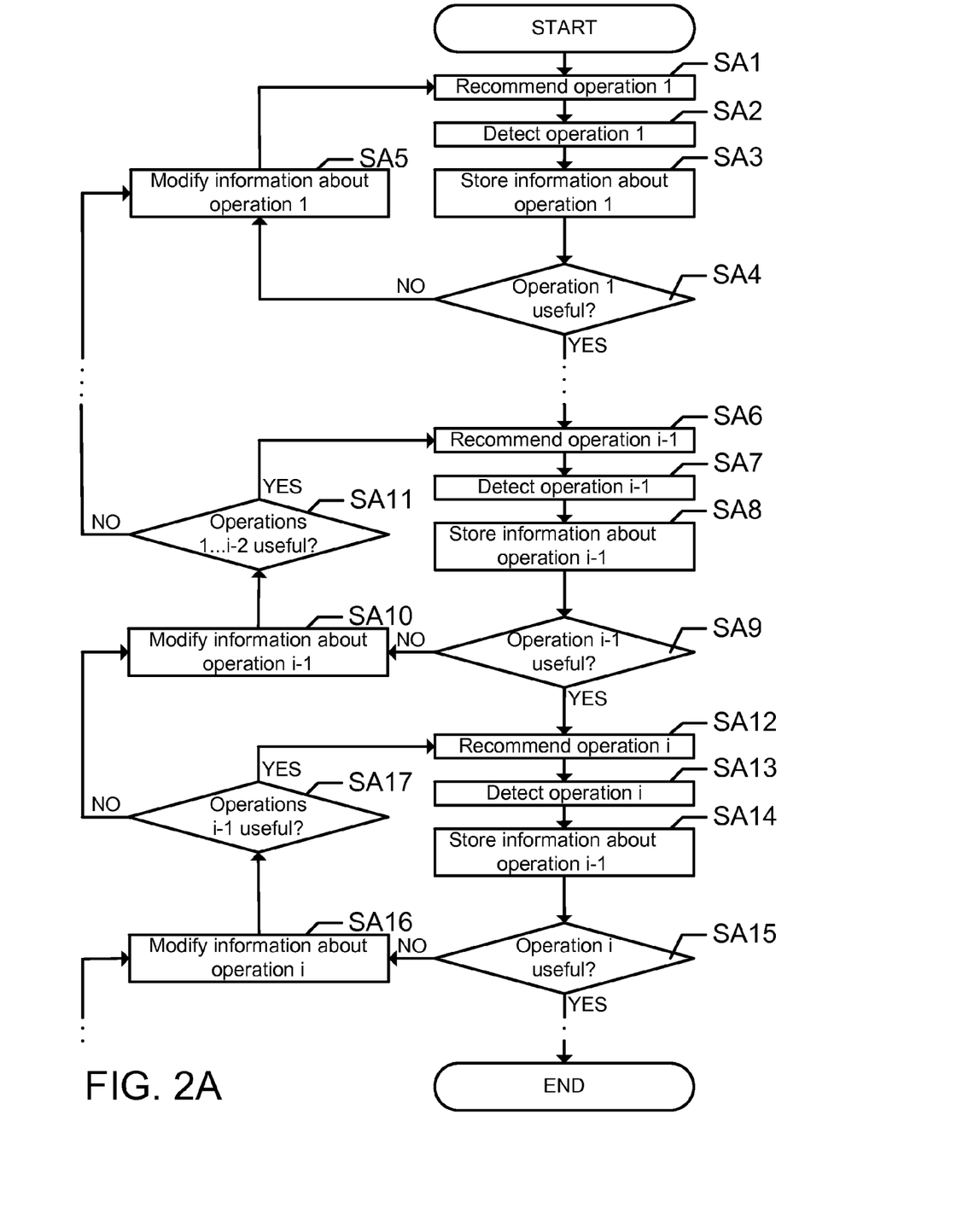
FIG. 2A shows a flowchart of a verification assistance method.

FIG. 2A shows a flowchart of a verification assistance method performed by the verification assistance module including the graphical user interface generation subprogram, the user operation handling subprogram, and the user operation processing subprogram. The verification assistance method is started as soon as the verification assistance module is started.

In step SA1, the verification assistance method recommends an operation 1. The operation handling subprogram initiated by the start of the verification assistance module generates one or several temporary recommendation window layout definition files 153 based on one or several user operation information data file(s) 154. The graphical user interface generation subprogram generates the components of the graphical user interface which is displayed on the monitor based on the one or several graphical user interface layout definition file(s) 156, 153 including the recommendation window layout definition files 153. The generated graphical user interface includes a recommendation window which is based on the one or several recommendation window layout definition files 156 and enables the user to choose one or several recommended operations (operation 1) easily by pressing a dedicated action button. The recommendation of a user operation initiated by the start of the verification assistance module is optional.

The user performs an operation 1. The operation 1 is a first operation of a sequence of several operations performed by the user. The operation 1 can be one of the operations recommended by the verification assistance method or a different operation.

In step SA2, the user operation handling subprogram detects the operation 1 performed by the user.

In step SA3, the user operation processing subprogram stores information about the performed operation 1. In general, the user operation processing subprogram verifies whether an entry for an identical or analogous operation having the same sequence position as the performed operation 1 and identical or analogous preceding operations in a sequence of user operations exists in a user operation information data file(s) 154. A first user operation has always identical or analogous preceding operations in a sequence of user operations. If there is such an entry, the user operation processing subprogram increments an operation count by 1. Thus, the only detail stored is that the operation was executed once more. If there is no such entry, the user operation processing subprogram adds such an entry having an operation count 1 (OC=1). The operation count indicates how often operation 1 was performed in a sequence of user operations at a certain sequence position and not considered as a useless operation. (An operation which is not considered as a useless operation is not necessarily a useful operation.) As the sequences of user operations may branch out, the operation count may refer only to a section of the sequence comprising the operation.

In step SA4, the user operation processing subprogram decides whether the first operation is useful or not. An operation can be defined as a useful operation or a useless operation. Thus, certain operations performed by the user are in general useful, whereas other operations performed by the user are in general useless. For this purpose, the user operation processing subprogram looks up in one or several user operation definition data file(s) 155 comprising a collection of useful and/or useless operations whether the operation performed by the user is defined as a useful operation or not. Alternatively, the user can enter in the graphical interface that an operation is useful or not by pressing a dedicated button.

If the operation 1 is not useful, the user operation processing subprogram modifies the stored information about the performed operation 1 in step SA5. The operation count is decremented by 1. If the operation count is 1 (OC=1) before decrementing, the stored details about operation 1 can be completely deleted. Then, the verification assistance method goes back to step SA1.

If operation 1 is useful, the verification assistance module recommends an operation i−1 in step SA6. In general, i is a natural number greater than 2. The actions described with respect to the recommended operation 1 in step SA1 are analogously performed with respect to the operation i−1.

The user performs a further operation i−1, wherein i is a natural number greater than 2. The operation i−1 is an operation having a sequence position i−1 in a sequence of several operations performed by the user. The operation i−1 can be one of the operations recommended by the verification assistance method or a different operation.

In step SA7, the user operation handling subprogram detects the operation i−1 performed by the user.

In step SA8, the user operation processing subprogram stores details of the operation 1 or increments an operation count by 1. The actions described with respect to the recommended operation 1 in step SA3 are analogously performed with respect to the operation i−1.

In step SA9, the trace analysis module decides whether the operation i−1 is useful or not. The actions described with respect to the recommended operation 1 in step SA4 are analogously performed with respect to the operation i−1.

If the operations i−1 is not useful, the user operation processing subprogram modifies the stored information about the performed operation i−1 in step SA10. The actions described with respect to the recommended operation 1 in step SA5 are analogously performed with respect to the operation i−1. Then, the verification assistance method continues with step SA11.

In step SA11, the trace analysis module decides whether all previously performed operations 1 . . . i−2 (in this case only operation 1) are useful or not. An operation cannot only be defined as useful or useless. An operation can also indicate that the preceding operations in an operation sequence are to be declared useless. For this purpose, the user operation processing subprogram looks up in one or several user operation definition data file(s) 155 which also comprise indications that certain operations are not only useless, but also indicate that previous operations are to be declared useless.

If all previous operations 1 . . . i−2 are useful, the verification assistance method goes back to step SA6.

If all previous operations 1 . . . i−2 are not useful, the verification assistance method goes back to step SA1.

If operation i−1 is useful, the trace analysis module recommends an operation i in step SA12. The operation i is an operation having a sequence position i of a sequence of several operations made by the user. The actions described with respect to the recommended operation 1 in step SA1 are analogously performed with respect to the operation i.

In step SA13, the user operation handling subprogram detects the operation i performed by the user.

In step SA14, the user operation processing subprogram stores information about the performed operation 1. The actions described with respect to the recommended operation 1 in step SA3 are analogously performed with respect to the operation i.

In step SA15, the user operation processing subprogram decides whether the operation i is useful or not. The actions described with respect to the recommended operation 1 in step SA3 are analogously performed with respect to the operation i.

If the operation 1 is not useful, the user operation processing subprogram modifies the stored information about the performed operation 1 in step SA16. Then, the verification assistance method continues with step SA17.

In step SA17, the trace analysis module decides whether all previously performed operations 1 . . . i−1 (in this case only operation 1) are useful or not. The actions described with respect to the recommended operation i−1 in step SA11 are analogously performed with respect to the operation i.

If all previously performed operations 1 . . . i−1 are useful, the verification assistance method goes back to step SA12.

If all previously performed operations 1 . . . i−i are not useful, the verification assistance method goes back to step SA1.

In general, the steps SA12, SA13, SA14, SA15, SA16, and SA17 form a group of steps which concern the processing of an operation i in a sequence of operations. If operation i is useful, the verification assistance module might recommend a further operation i+1 in a step which belongs to a subsequent group of steps concerning the processing of an operation i+1 analogous to the processing of an operation i in the preceding group of steps concerning the processing of an operation i in a sequence of operations. No further operation is recommended if the operation i is the last operation for which details are stored in a sequence of operations.

Figure 2B:
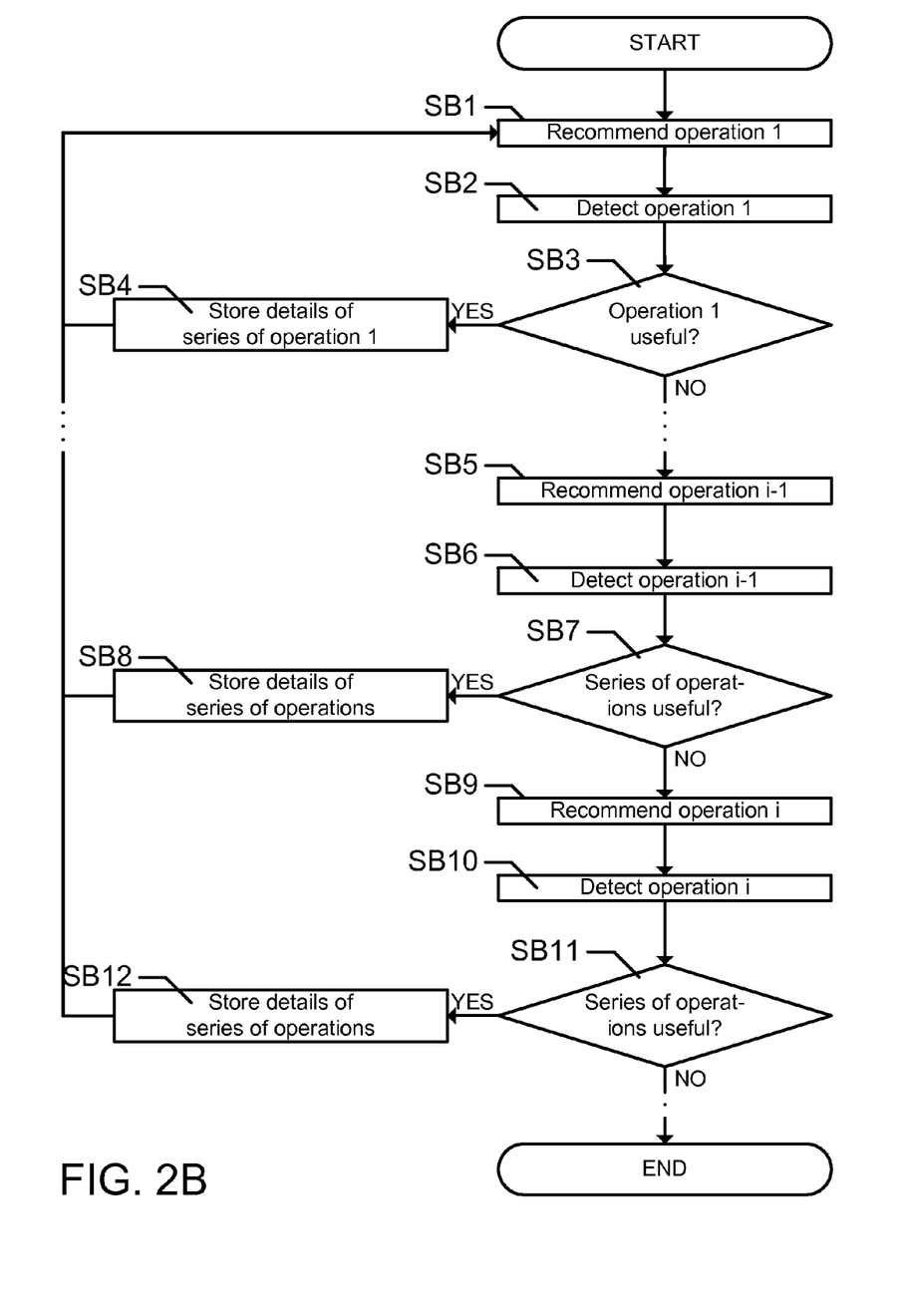
FIG. 2B shows a flowchart of a further verification assistance method.

FIG. 2B shows a flowchart of a further verification assistance method performed by the verification assistance module including the graphical user interface generation subprogram, the user operation handling subprogram, and the user operation processing subprogram. The verification assistance method is started as soon as the verification assistance module is started.

In step SB1, the verification assistance method recommends an operation 1. Step SB1 is identical to step SA1.

The user performs an operation 1. The operation 1 is a first operation of a sequence of several operations performed by the user. The operation 1 can be one of the operations recommended by the verification assistance method or a different operation.

In step SB2, the user operation handling subprogram detects the operation 1 performed by the user.

In step SB3, the user operation processing subprogram decides whether the first operation is useful or not. The user operation processing subprogram actually decides whether all operations of an operation sequence performed so far are useful. However, the operation sequence comprises only a single operation in step SB3.

An operation can indicate that all operations of an operation sequence performed so far are useful. Thus, certain operations performed by the user indicate in general that all operations of an operation sequence performed so far are useful, whereas other operations indicate in general that all operations of an operation sequence performed so far are not useful. For this purpose, the user operation processing subprogram looks up in one or several user operation definition data file(s) 155 comprising a collection of operations comprising indications that all operations performed so far in an operation sequence are useful. Alternatively, the user can enter in the graphical interface that all operations performed so far (only operation 1 in this case) are useful or not by pressing a dedicated button.

If the operation 1 is useful, the user operation processing subprogram stores information about the performed operation 1 in step SB4. Step SB4 is identical to step SA3.

If the operation 1 is not useful, the verification assistance method recommends the user an operation i−1 in step SB5. In general, i is a natural number greater than 2. The actions described with respect to the recommended operation 1 in step SA1 are analogously performed with respect to the operation i−1.

The user performs a further operation i−1, wherein i is a natural number greater than 2. The operation i−1 is an operation having a sequence position i−1 of a sequence of several operations performed by the user. The operation i−1 can be one of the operations recommended by the verification assistance method or a different operation.

In step SB6, the user operation handling subprogram detects the operation i−1 performed by the user.

In step SB7, the trace analysis module decides whether all previous operations are useful or not. The actions described with respect to the recommended operation 1 in step SB3 are analogously performed with respect to the operation i−1.

If the sequence of operations 1 . . . i−1 is useful, the user operation processing subprogram stores the details of the operations 1, . . . i−1 in step SB8. The actions described with respect to the recommended operation 1 in step SA4 are analogously performed with respect to the operations 1, . . . i−1. Then, the verification assistance method goes to step SB1.

If the operation i−1 is not useful, the verification assistance method recommends an operation i in step SB9. The actions described with respect to the recommended operation 1 in step SA1 are analogously performed with respect to the operation i.

The user performs a further operation i. The operation i is an operation having a sequence position i of a sequence of several operations performed by the user. The operation i can be one of the operations recommended by the verification assistance method or a different operation.

In step SB10, the user operation handling subprogram detects the operation i of the user.

In step SB11, the trace analysis module decides whether the sequence of operations 1 . . . i−1, i is useful or not. The actions described with respect to the recommended operation 1 in step SB3 are analogously performed with respect to the operation i.

If the sequence of operations 1 . . . i is useful, the user operation processing subprogram stores the details of the operations 1 . . . i in step SB12. The actions described with respect to the recommended operation 1 in step SA4 are analogously performed with respect to the operations 1, . . . i−1. Then, the verification assistance method goes to step SB1.

In general, the steps SB9, SB10, SB11, and SB12 form a group of steps which concern the processing of an operation i of a sequence of operations. If the operation i is not useful, the trace analysis module might recommend a further operation i+1 in a step which belongs to a subsequent group of steps concerning the processing of an operation i+1 analogous to the processing of step i of a preceding group of steps concerning the processing of an operation i of a sequence of operations.

Figure 3:
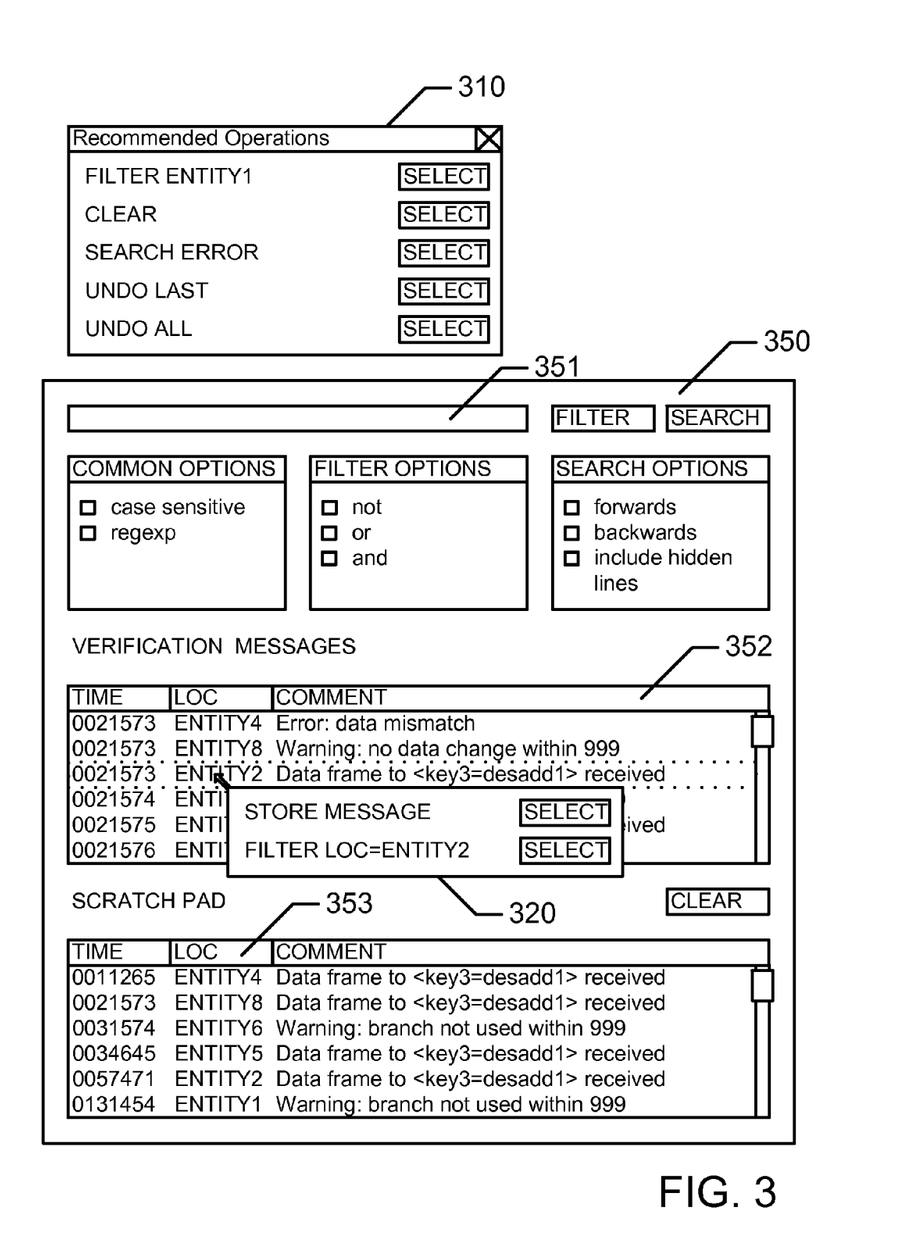
FIG. 3 shows a graphical user interface of a verification assistance program.

FIG. 3 exemplifies a graphical user interface of a verification assistance module displayed on the monitor. The graphical user interface comprises a main window 350, an operation recommendation window 310, and an operation selection window 320. The graphical user interface and in particular the actions which are performed when the user presses a respective dedicated button serve as examples. Furthermore, the graphical user interface could enable the user to perform far more and different actions by pressing dedicated buttons. Therefore, a detailed description of the actions which can be performed is not given. The modification of the graphical interface always proceeds in the same way. The user performs an operation such as pressing a button. The user operation handling subprogram detects the operation by the user and sends a corresponding instruction to the user operation processing subprogram. The user operation processing subprogram modifies or adds on one or several graphical user interface layout definition file(s). The graphical user interface generation subprogram generates the components of the graphical user interface which is displayed on the monitor based on one or several modified or added graphical user interface layout definition file(s). Hereinafter, these procedure steps are not mentioned, but are always implicitly included when the user performs an operation resulting in a modification of the graphical user interface.

The main window 350 comprises a text field 351, an action button "FILTER", an action button "SEARCH", two check boxes for selecting the common options "case sensitive" or "regexp" of the filter action and the search action, two check boxes for selecting the options "not", "or", or "and" of the filter action, and three check boxes for selecting the options "forwards", "backwards", and "include hidden lines" for selecting these options of the search action, a verification message field 352, a further verification message field 353 named "SCRATCH PAD", and an action button "CLEAR". The verification messages are displayed in the verification message field 352 comprising a scroll bar. Each verification message comprises a time stamp, location information "LOC", and a comment "COMMENT". A selected message framed by the dotted line in the verification message field 352 comprises an identifier "key1" which can be recognized by the first position in the angle bracket in front of the equal-sign. The identifier "key1" indicates that the destination address "desadd1" is the destination address of the first data frame received by the entity referred to in the selected message, wherein definitions of the identifiers are stored in one or several identifier definition data file(s). The test vectors generated by the circuit simulation module 142 (see FIG. 1) can be formed so that each data frame has a unique destination address and that the data frame with a specific destination address must therefore be the first data frame received by the entity referred to in the selected message. In the further message field named 353 "SCRATCH PAD", specific verification messages are displayed which are copied from the verification message field 352. When entering a term in the text field 351 and pressing the button "FILTER", the verification assistance module displays only the messages comprising the entered term in the verification message field 352. When entering a term in the text field 351 and pressing the button "SEARCH", the verification assistance program searches a message comprising the entered term in the verification message field 352. Additionally, the user can choose one of the common options "case sensitive" or "regexp" by selecting the respective check box when performing a search action or a filter action, one of the filter options "not", "or", or "and" by selecting the respective check box when performing a filter action, and one of the search options "forwards", "backwards", and "include hidden lines" by selecting the respective check box when performing a search action. When pressing the button "CLEAR", the messages in the scratch pad are deleted.

The operation selection window 320 is opened by pressing a mouse button while a verification message is selected and enables the user to select one of the two actions "STORE MESSAGE" and "FILTER LOC=ENTITY2". When selecting the action "STORE MESSAGE", the selected message is stored in the further verification message field 353 named "SCRATCH PAD". When selecting the action "FILTER LOC=ENTITY2", the verification assistance module displays only the messages containing "ENTITY2" as local information. The selectable operations can depend on the exact position of a mouse cursor. In the present case, the mouse cursor points to the local information. Therefore, an option concerning the local information is displayed.

The operation recommendation window 310 enables the user to select one of the five actions "FILTER ENTITY1", "CLEAR", "SEARCH ERROR", "UNDO LAST", or "UNDO ALL". When selecting the action "FILTER ENTITY1", only the messages containing the term "ENTITY1" are displayed in the verification message field 352. When selecting the action "CLEAR", the messages in the further verification message field 353 named "SCRATCH PAD" are deleted. When selecting the action "SEARCH ERROR", the verification assistance module searches for a message containing "ERROR" in the verification message field 352. When selecting the message "UNDO LAST", the last operation performed by the user is undone. When selecting the action "UNDO ALL", all operations performed by the user during the present session are undone.

Details of the performed operations are stored in the one or several user operation information data file(s) 154. An entry for an operation comprises an operation comment, a unique operation key, an operation count, and a reference to the next operation(s) in a sequence of operations if there are any. The operation comment can include one or several unique identifier(s). Details of the operation to be performed by the user operation processing subprogram are defined by the unique operation key and unique identifier(s) stored in the one or several user operation definition data file(s) 155. Some operations defined in the user operation definition data file(s) 243 do not require an identifier because they correspond to commands which can be executed irrespective of further details depending on the context of the present operation. In this case, the recommended operation is identical to a stored operation. For example, after selecting a message, the command "STORE MESSAGE" which results in the display of the selected message in the further verification message field 353 "SCRATCH PAD" can be executed irrespective of further details. Other operations correspond to commands which cannot be executed irrespective of further details depending on the context of the present operation. In this case, the recommended operation is analogous to a stored operation. An example of such an operation is explained hereinafter with reference to FIG. 4A.

Figure 4A:
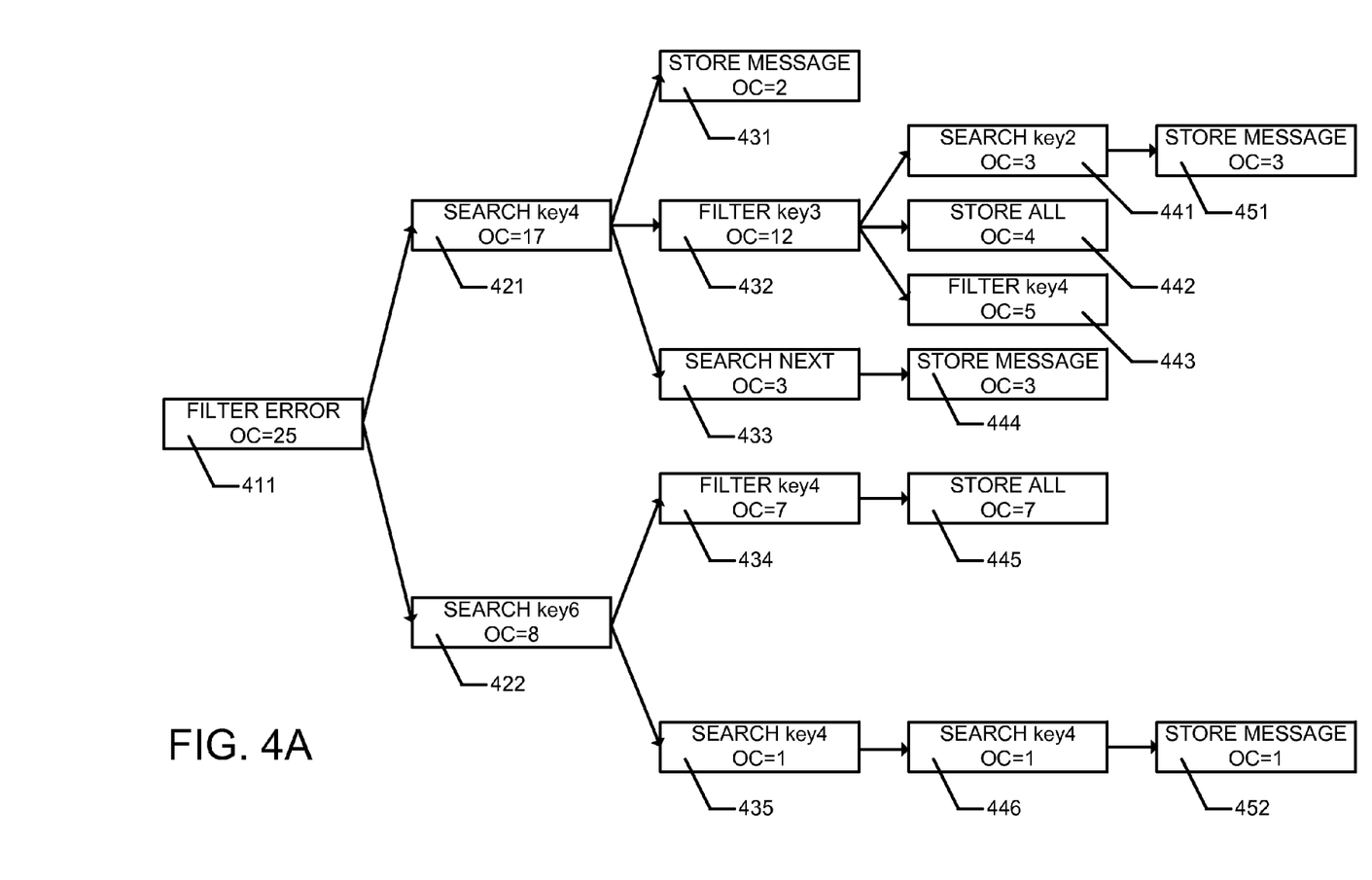
FIG. 4A shows a tree data structure according to which operation information concerning user operations of several operation sequences were stored by a verification assistance method.

FIG. 4A shows a tree data structure according to which operation information concerning user operations of several operation sequences were stored by a verification assistance method. Entries for useful operations are represented as nodes 411, 421, 422, 431, 432, 433, 434, 435, 441, 442, 443, 444, 445, 446, 451, and 452 which are connected by branches. Entries which represent useful operations have an operation count larger than 0 (OC>0). The operation count indicates how often an operation represented by the respective node was considered useful, wherein the operation was directly preceded by the operation represented by the parent node of the respective node, and wherein the operation represented by this parent node was preceded by the operation represented by the parent node of this parent node and so on. Child nodes always represent operations which were performed directly after the operation represented by the respective parent node in one or several operation sequences. Each parent node can have several child nodes. Each child node has a single parent node. For example, the node 432 is a child node of node 421, whereas the node 421 is a parent node of the nodes 431, 432, and 433. The operation count of a parent node is at least as high as the sum of the operation counts of the child nodes. The nodes 411, 431, 433, 442, 444, 445, 451, and 452 each represent identical operations, whereas the nodes 421, 422, 432, 434, 435, 441, 443, and 446 each represent analogous operations. The operation information for analogous operations comprises identifiers "key2, key3, key4, key6" indicating how the respective operation refers to its context as defined in one or several identifier definition data file(s). The identifiers are identical to identifiers used in the comments, wherein identical identifiers have the same meaning. The identifier "key2" indicates that the respective operation refers to the destination address of a first data packet received by the entity referred to in a selected message. The identifier "key3" indicates that the respective operation refers to the source address of a first data packet received by the entity referred to in a selected message. The identifier "key4" indicates that the respective operation refers to the source address of a data packet directly received before a data packet by the entity referred to in a selected message. The identifier "key6" indicates that the respective operation refers to the destination address of a data packet mentioned in the parent node.

Figures 4B, 4C:
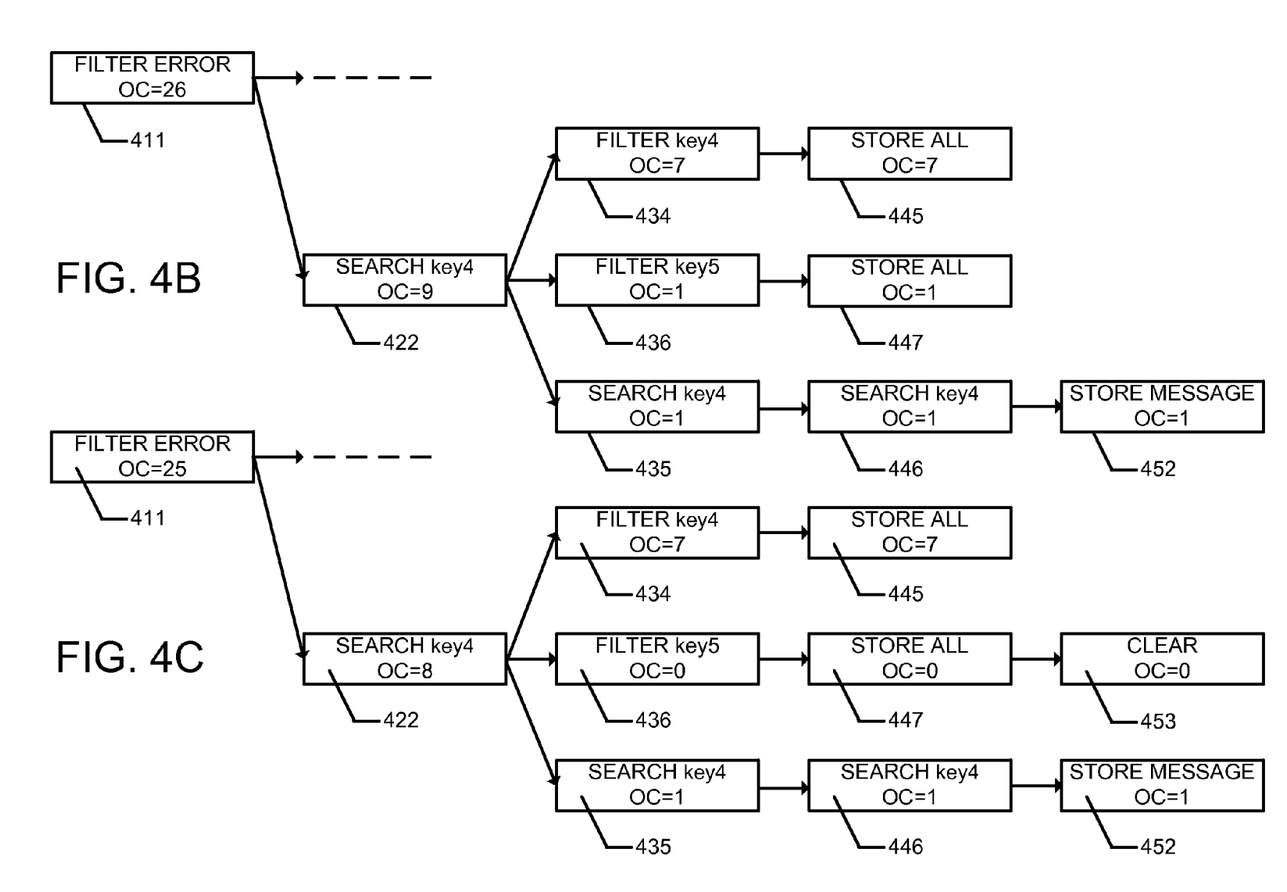
FIG. 4B shows a right main branch of the tree data structure of FIG. 4A to which two nodes are added.
FIG. 4C shows the right main branch of the tree data structure of FIG. 4B after a clear operation.

The user operations are recommended according to the tree structure shown in FIG. 4A, wherein the verification assistance method recognizes the respective information for analogous operations by means of identifiers in the verification data as explained with reference to FIG. 3. If the user selected "FILTER ERROR" as a first operation in a verification assistance method, the verification assistance module would recommend the operations "SEARCH SAD1" and "SEARCH DAD1" as the second operation, wherein "SAD1" is the source address of a data packet directly received before a data packet by the entity referred to in a selected message comprising the word "ERROR", and wherein "DAD1" is the destination address of a data packet mentioned in the parent node of node 411. If the user selected "SEARCH SAD1" as the second operation, the verification assistance module would recommend the operations "STORE MESSAGE", "FILTER SAD4", and "SEARCH NEXT" as the third operations and so on, wherein "SAD4" is the source address of a first data packet received by the entity referred to in a selected message FIG. 4B shows a right main branch of the data structure of FIG. 4A to which two further nodes 436 and 447 are added. The respective operations were recognized as useful operations by the verification assistance method. The operation counts of the operations of the nodes 411 and 422 preceding the nodes 436 and 447 are incremented by 1, respectively. Each of the added operations of the nodes 436 and 447 has the operation count 1.

FIG. 4C shows the right main branch of the data structure of FIG. 4A, when a clear operation is performed after the operations of the nodes 411 and 422 indicating that all operations in an operation sequence are useless. The operation counts of the operations of the nodes 411, 422, 436, and 447 are decremented by 1. The nodes 411 and 422 have the operation count 0 (OC=0) and can be deleted optionally. The respective actions of the nodes 411 and 422 are no longer recommended.

The invention claimed is:

1. A method of assisting verification of a digital circuit design, the method comprising:
    a data processing system presenting, within a graphical user interface of a display device, a presentation including a plurality of graphical verification notifications arising from verification of a digital circuit design;
    the data processing system detecting one or more user operations by which a user interacts with the plurality of graphical verification notifications utilizing one or more user input devices and storing, in a memory, user operation information regarding the one or more user operations detected by the data processing system; and
    the data processing system determining, based on said user operation information, a recommended subsequent user operation and presenting, within the graphical user interface, a user-selectable indication of the recommended subsequent user operation, wherein said recommended subsequent user operation is analogous to a user operation of a previous sequence of multiple user operations, and wherein said user operation information in the previous sequence of multiple user operations includes reference information specifying details of a context to which the one or more user operations apply.

2. The method of claim 1, wherein:
    said user operation information includes a sequence position of a particular user operation within the previous sequence of multiple user operations; and
    the recommended subsequent user operation has a same sequence position in a subsequent sequence of multiple user operations as the particular user operation has in said previous sequence of multiple user operations.

3. The method of claim 1, wherein said recommended subsequent user operation is identical to the user operation of the previous sequence of multiple user operations.

4. A method of assisting verification of a digital circuit design, the method comprising:
    a data processing system presenting, within a graphical user interface of a display device, a presentation including a plurality of graphical verification notifications arising from verification of a digital circuit design;
    the data processing system detecting one or more user operations by which a user interacts with the plurality of graphical verification notifications utilizing one or more user input devices and storing, in a memory, user operation information regarding the one or more user operations detected by the data processing system;
    the data processing system determining, based on said user operation information, a recommended subsequent user operation and presenting, within the graphical user interface, a user-selectable indication of the recommended subsequent user operation, and
    the data processing system filtering out one or more unuseful user operations such that the data processing system determines the recommended subsequent user operation based only on useful user operation information.

5. A method of assisting verification of a digital circuit design, the method comprising:
    a data processing system presenting, within a graphical user interface of a display device, a presentation including a plurality of graphical verification notifications arising from verification of a digital circuit design;
    the data processing system detecting one or more user operations by which a user interacts with the plurality of graphical verification notifications utilizing one or more user input devices and storing, in a memory, user operation information regarding the one or more user operations detected by the data processing system;
    the data processing system determining, based on said user operation information, a recommended subsequent user operation and presenting, within the graphical user interface, a user-selectable indication of the recommended subsequent user operation;
    in response to user selection of the user-selectable indication of the recommended subsequent user operation, the data processing system performing the recommended subsequent user operation and thereafter determining whether the recommended subsequent user operation is useful; and
    in response to determining that the recommended subsequent user operation is not useful, modifying the user operation information.

6. A method of assisting verification of a digital circuit design, the method comprising:
    a data processing system presenting, within a graphical user interface of a display device, a presentation including a plurality of graphical verification notifications arising from verification of a digital circuit design;
    the data processing system detecting one or more user operations by which a user interacts with the plurality of graphical verification notifications utilizing one or more user input devices and storing, in a memory, user operation information regarding the one or more user operations detected by the data processing system; and the data processing system determining, based on said user operation information, a recommended subsequent user operation and presenting, within the graphical user interface, a user-selectable indication of the recommended subsequent user operation, wherein the recommended subsequent user operation includes filtering the plurality of graphical verification notifications based on a design entity within the digital circuit design.

7. A verification assistance program product, comprising:
a data processing system-readable storage device; and
program code stored on the computer-readable storage device that, when executed by a data processing system, causes the data processing system to assist verification by:
the data processing system presenting, within a graphical user interface of a display device, a presentation including a plurality of graphical verification notifications arising from verification of a digital circuit design;
the data processing system detecting one or more user operations by which a user interacts with the plurality of graphical verification notifications utilizing one or more user input devices and storing, in a memory, user operation information regarding the one or more user operations detected by the data processing system; and
the data processing system determining, based on said user operation information, a recommended subsequent user operation and presenting, within the graphical user interface, a user-selectable indication of the recommended subsequent user operation, wherein said recommended subsequent user operation is analogous to a user operation of a previous sequence of multiple user operations, and wherein said user operation information in the previous sequence of multiple user operations includes reference information specifying details of a context to which the one or more user operations apply.

8. The verification assistance program product of claim 7, wherein:
said user operation information includes a sequence position of a particular user operation within the previous sequence of multiple user operations; and
the recommended subsequent user operation has a same sequence position in a subsequent sequence of multiple user operations as the particular user operation has in said previous sequence of multiple user operations.

9. The verification assistance program product of claim 7, wherein said recommended subsequent user operation is identical to the user operation of the previous sequence of multiple user operations.

10. A verification assistance program product, comprising:
a data processing system-readable storage device; and
program code stored on the computer-readable storage device that, when executed by a data processing system, causes the data processing system to assist verification by:
the data processing system presenting, within a graphical user interface of a display device, a presentation including a plurality of graphical verification notifications arising from verification of a digital circuit design;
the data processing system detecting one or more user operations by which a user interacts with the plurality of graphical verification notifications utilizing one or more user input devices and storing, in a memory, user operation information regarding the one or more user operations detected by the data processing system;
the data processing system determining, based on said user operation information, a recommended subsequent user operation and presenting, within the graphical user interface, a user-selectable indication of the recommended subsequent user operation;
the data processing system filtering out one or more unuseful user operations such that the data processing system determines the recommended subsequent user operation based only on useful user operation information.

11. A verification assistance program product, comprising:
a data processing system-readable storage device; and
program code stored on the computer-readable storage device that, when executed by a data processing system, causes the data processing system to assist verification by:
the data processing system presenting, within a graphical user interface of a display device, a presentation including a plurality of graphical verification notifications arising from verification of a digital circuit design;
the data processing system detecting one or more user operations by which a user interacts with the plurality of graphical verification notifications utilizing one or more user input devices and storing, in a memory, user operation information regarding the one or more user operations detected by the data processing system;
the data processing system determining, based on said user operation information, a recommended subsequent user operation and presenting, within the graphical user interface, a user-selectable indication of the recommended subsequent user operation;
the data processing system, in response to user selection of the user-selectable indication of the recommended subsequent user operation, performing the recommended subsequent user operation and thereafter determining whether the recommended subsequent user operation is useful; and
the data processing system, in response to determining that the recommended subsequent user operation is not useful, modifying the user operation information.

12. A verification assistance program product, comprising:
a data processing system-readable storage device; and
program code stored on the computer-readable storage device that, when executed by a data processing system, causes the data processing system to assist verification by:
the data processing system presenting, within a graphical user interface of a display device, a presentation including a plurality of graphical verification notifications arising from verification of a digital circuit design;
the data processing system detecting one or more user operations by which a user interacts with the plurality of graphical verification notifications utilizing one or more user input devices and storing, in a memory, user operation information regarding the one or more user operations detected by the data processing system;
the data processing system determining, based on said user operation information, a recommended subsequent user operation and presenting, within the graphical user interface, a user-selectable indication of the recommended subsequent user operation, wherein the recommended subsequent user operation includes filtering the plurality of verification notifications based on a design entity within the digital circuit design.

13. A verification assistance system, comprising:
a processor;
storage device coupled to the processor; and
program code stored on the storage device that, when executed by the processor, causes the computer system to assist verification by:
  presenting, within a graphical user interface of a display device, a presentation including a plurality of graphical verification notifications arising from verification of a digital circuit design;
  detecting one or more user operations by which a user interacts with the plurality of graphical verification notifications utilizing one or more user input devices and storing, in a memory, user operation information regarding the one or more user operations detected by the data processing system; and
  determining, based on said user operation information, a recommended subsequent user operation and presenting, within the graphical user interface, a user-selectable indication of the recommended subsequent user operation, wherein said recommended subsequent user operation is analogous to a user operation of a previous sequence of multiple user operations, and wherein said user operation information in the previous sequence of multiple user operations includes reference information specifying details of a context to which the one or more user operations apply.

14. The verification assistance system of claim 13, wherein:
  said user operation information includes a sequence position of a particular user operation within the previous sequence of multiple user operations; and
  the recommended subsequent user operation has a same sequence position in a subsequent sequence of multiple user operations as the particular user operation has in said previous sequence of multiple user operations.

15. The verification assistance system of claim 13, wherein said recommended subsequent user operation is identical to the user operation of the previous sequence of multiple user operations.

16. A verification assistance system, comprising:
a processor;
storage device coupled to the processor; and
program code stored on the storage device that, when executed by the processor, causes the computer system to assist verification by:
  presenting, within a graphical user interface of a display device, a presentation including a plurality of graphical verification notifications arising from verification of a digital circuit design;
  detecting one or more user operations by which a user interacts with the plurality of graphical verification notifications utilizing one or more user input devices and storing, in a memory, user operation information regarding the one or more user operations detected by the data processing system;
  determining, based on said user operation information, a recommended subsequent user operation and presenting, within the graphical user interface, a user-selectable indication of the recommended subsequent user operation; and
  filtering out one or more unuseful user operations such that the data processing system determines the recommended subsequent user operation based only on useful user operation information.

17. A verification assistance system, comprising:
a processor;
storage device coupled to the processor; and
program code stored on the storage device that, when executed by the processor, causes the computer system to assist verification by:
  presenting, within a graphical user interface of a display device, a presentation including a plurality of graphical verification notifications arising from verification of a digital circuit design;
  detecting one or more user operations by which a user interacts with the plurality of graphical verification notifications utilizing one or more user input devices and storing, in a memory, user operation information regarding the one or more user operations detected by the data processing system; and
  determining, based on said user operation information, a recommended subsequent user operation and presenting, within the graphical user interface, a user-selectable indication of the recommended subsequent user operation;
  in response to user selection of the user-selectable indication of the recommended subsequent user operation, the data processing system performing the recommended subsequent user operation and thereafter determining whether the recommended subsequent user operation is useful; and
  in response to determining that the recommended subsequent user operation is not useful, modifying the user operation information.

18. A verification assistance system, comprising:
a processor;
storage device coupled to the processor; and
program code stored on the storage device that, when executed by the processor, causes the computer system to assist verification by:
  presenting, within a graphical user interface of a display device, a presentation including a plurality of graphical verification notifications arising from verification of a digital circuit design;
  detecting one or more user operations by which a user interacts with the plurality of graphical verification notifications utilizing one or more user input devices and storing, in a memory, user operation information regarding the one or more user operations detected by the data processing system; and
  determining, based on said user operation information, a recommended subsequent user operation and presenting, within the graphical user interface, a user-selectable indication of the recommended subsequent user operation, wherein the recommended subsequent user operation includes filtering the plurality of graphical verification notifications based on a design entity within the digital circuit design.

* * * * *